United States Patent

[11] 3,579,112

[72] Inventor Jack R. Harford
Flemington, N.J.
[21] Appl. No. 803,728
[22] Filed Mar. 3, 1969
[45] Patented May 18, 1971
[73] Assignee RCA Corporation

[54] AUTOMATIC GAIN CONTROL SYSTEMS
10 Claims, 1 Drawing Fig.

[52] U.S. Cl. 325/319, 325/404, 325/410, 325/413, 330/29, 330/38
[51] Int. Cl. H03g 3/30
[50] Field of Search 325/318, 319, 404, 405, 410, 411, 412, 413; 178/7.3, 6 (A.G.C); 330/29, 127, 38, 38 (M); 323/66; 330/25, 21, 40, 22

[56] References Cited

UNITED STATES PATENTS

| | | | |
|---|---|---|---|
| 3,153,189 | 10/1964 | Sweeney | 323/66 |
| 3,319,177 | 5/1967 | Aemmer | 325/319X |
| 3,450,834 | 6/1969 | De Marinis et al. | 178/7.3 |

*Primary Examiner*—Benedict V. Safourek
*Attorney*—Eugene M. Whitacre

ABSTRACT: In a superheterodyne receiver, IF output of tuner, together with an IF AGC bias potential, are applied via a dynamic attenuator network to an IF amplifier input electrode. Delay transistor, biased into saturation, holds off (a) a transistor serving as the active device of the attentuator network, and (b) a transistor serving as an RF AGC drive transistor, over a first range of received signal levels below a first threshold level. AGC bias variations applied to amplifier input electrode varies IF amplifier gain without affecting IF attenuator or tuner in the first range. At a given AGC bias level (to which delay transistor base is responsive) delay transistor comes out of saturation and its collector potential (to which the bases of attenuator and RF AGC transistors are responsive) varies inversely with AGC bias. At first threshold level, delay transistor collector potential departs sufficiently from saturation potential to initiate RF AGC transistor conduction, and RF AGC action commences. A full range of RF AGC action is traversed before delay transistor collector potential arrives at level-initiating attenuator transistor conduction. Beyond this second threshold level, attenuator action occurs and a negative DC feedback loop is closed which holds IF amplifier bias relatively constant. Receiver signal control thus follows sequence including at least three phases: (1) a weak-signal phase, wherein AGC action is confined to IF amplifier gain variations; (b) a medium-signal phase, wherein IF amplifier gain variations are accompanied by RF amplifier gain variations; and (c) a strong-signal phase, wherein control is confined essentially to IF attenuator action.

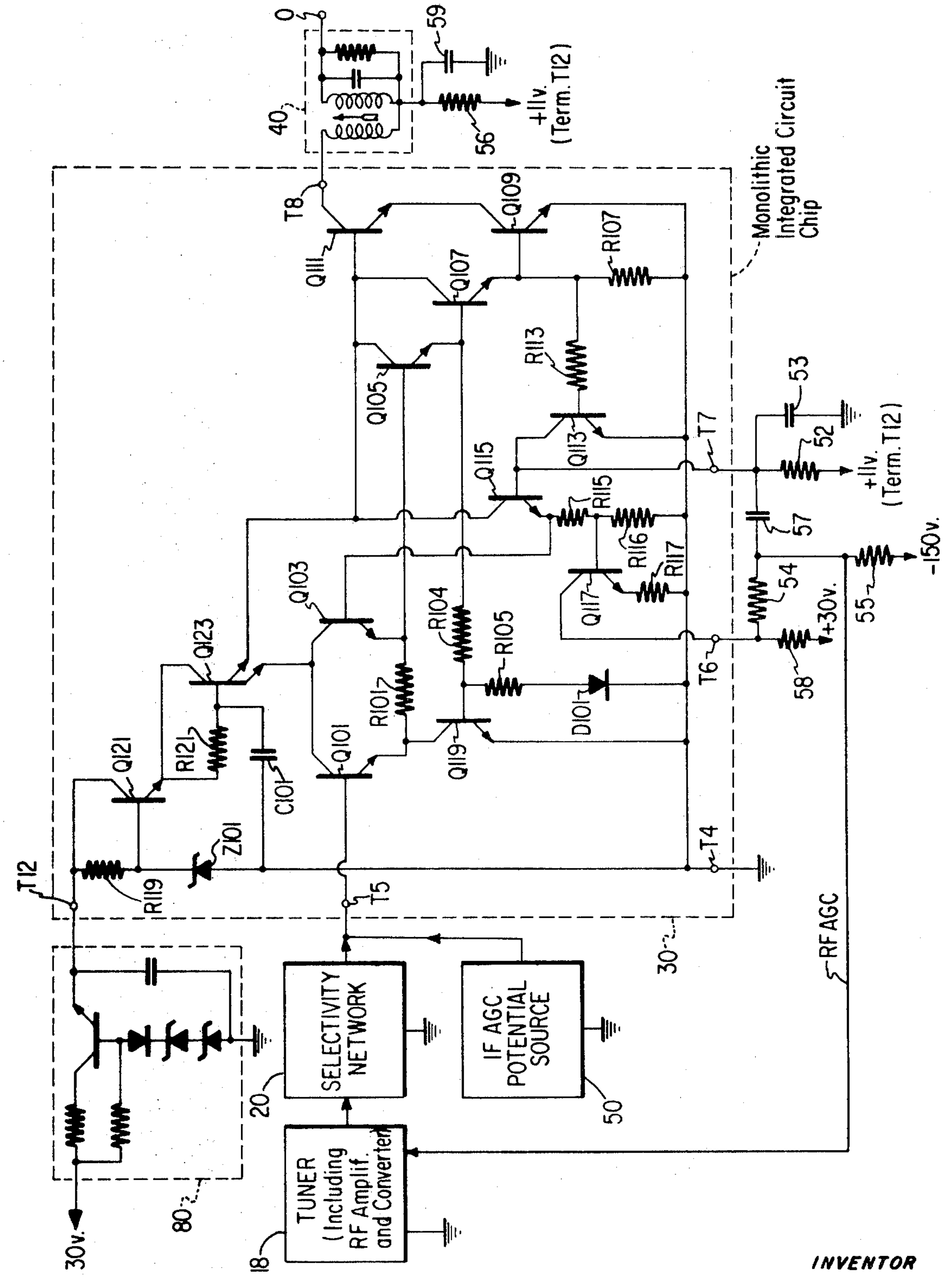
INVENTOR
Jack R. Harford
BY William H. Meagher
ATTORNEY

AUTOMATIC GAIN CONTROL SYSTEMS

This invention relates generally to automatic gain control (AGC) systems for superheterodyne receiving apparatus, and, particularly, to AGC systems applicable to use in association with superheterodyne receivers incorporating intermediate frequency (IF) amplifiers fabricated with integrated circuit (IC) techniques.

Disclosed in my copending application, Ser. No. 766,905, filed Oct. 11, 1968, and entitled "Wide-Band Amplifier," now abandoned in favor of a continuation application, Ser. No. 41,755, filed June 3, 1970, is a gain-controllable IF amplifier arrangement suitable for realization in integrated form on a monolithic integrated circuit chip. In the arrangement disclosed in that application, input signals are applied to a voltage amplifier stage via a dynamic attenuator network. A delay transistor biased into saturation, holds off a transistor serving as the active device of the attenuator network over a first range of received signal levels below a given threshold level, resulting in a constant, small degree of introduced attenuation. AGC bias variations applied to the input electrode of the amplifier stage serve to vary the gain of the amplifier stage without altering the network attenuation in the first range of operation.

The forward bias on the base of the delay transistor is made responsive to the AGC bias. At a chosen AGC bias level, reflecting a given received signal level, the delay transistor comes out of saturation, permitting the delay transistor collector potential to vary (inversely) with AGC bias. At a still greater signal level, the delay transistor collector potential variation from its saturation potential is sufficient to bias the attenuator transistor into conduction. For signal strengths increasing above this threshold, the attenuator provides increasing degrees of attenuation, thus limiting the voltage swing at the amplifier input electrode. Attenuator transistor conduction closes a DC negative feedback loop which holds the bias at the amplifier input electrode relatively constant in the face of input AGC variations reflecting signal levels above the threshold. Thus, in the second, above-threshold, range of operation, control is essentially confined to attenuator action, with the gain of the amplifier stage remaining relatively constant.

The above-described arrangement of my copending application facilitates handling of a wide range of input signals by the IF amplifier, with distortion at the strong-signal end of the range avoided without introducing impairment of signal-to-noise ratio at the weak-signal end of the range. Moreover, as disclosed in said copending application, the attenuator network and associated delay transistor circuit may conveniently be realized in integrated form on the same monolithic integrated circuit chip as the associated amplifier stage.

The present invention is directed to a modification of the above-described arrangement enabling accurately controlled association of a delayed RF AGC action with the aforementioned IF gain control and IF attenuator actions. Pursuant to the present modification, derivation of an AGC potential for control of RF amplification of received signals prior to conversion to intermediate frequencies is associated with the delay apparatus controlling IF attenuator action. Use of common delay apparatus controlling IF attenuator action. Use of common delay apparatus enables accurate relating of the respective thresholds of RF AGC and IF attenuator actions.

In a preferred application of the principles of the present invention, directed toward optimizing the signal-handling range of the superheterodyne receiver, signal amplitude control in response to an AGC potential source follows a sequence including at least three distinct phases: (a) a weak-signal phase, wherein AGC action is confined to IF amplifier gain variations; (b) a medium-signal phase, wherein IF amplifier gain variations are accompanied by RF amplifier gain variations; and (c) a strong-signal phase, wherein AGC action is confined essentially to IF attenuator action.

In accordance with a specific embodiment of the present invention, a delay transistor functioning as previously described is coupled to control both an IF attenuator transistor and an RF AGC drive transistor. Conduction of the latter is initiated at a signal threshold level (indicated by IF amplifier bias level) below that causing initiation of attenuator transistor conduction, and a full range of RF AGC action is traversed before reaching the latter level. When attenuator action begins, the previously mentioned negative feedback loop closing serves to stabilize IF amplifier gain at a relatively constant value. The same monolithic integrated circuit chip which incorporates the controlled IF amplifier, delay transistor circuit and attenuator network may conveniently accommodate the RF AGC drive transistor circuit.

An object of the present invention is to provide a superheterodyne receiver with a delayed RF AGC system associated in a novel manner with IF signal control to enhance the signal handling range of the receiver.

Other objects and advantages of the present invention will be recognized by those skilled in the art upon a reading of the following detailed description and an inspection of the accompanying DRAWING in which a portion of a superheterodyne receiver embodying the present invention is illustrated, partly in schematic detail and partly by block diagram representation.

In the drawing, a tuner 18 is illustrated in block form; the tuner 18 incorporates apparatus for performing the conventional functions of selectively amplifying a desired one of various received RF signals, and converting the selected RF signal to intermediate frequencies. A selectivity network 20, providing a band-pass characteristic appropriate to the particular receiver's IF operating frequencies, couples the output of tuner 18 to the IF input terminal T5 of a monolithic integrated circuit chip 30. Chip 30 includes circuitry performing an IF amplifier function (as will be described in more detail subsequently) and provides an IF amplifier output signal at chip terminal T8. A second selectivity network 40, further defining the IF passband, couples the IF signals at chip terminal T8 to an output terminal O. While the subsequent receiver circuits (not illustrated) may differ depending on the particular signals for which the receiver is provided, typically additional IF amplifier stages will be interposed between terminal O and the receiver's IF signal-detecting apparatus.

An IF AGC potential source 50 supplies a variable bias to the IF input terminal T5 of chip 30. The IF AGC potential source 50 is shown in block form only in the drawing. A variety of ways of developing a suitable IF AGC potential from detected IF signals are known to the art, and the present invention is not concerned with the details thereof. For the particular circuit embodiment of the drawing, it may be assumed that source 50 supplies a positive bias potential to terminal T5 which becomes less positive with increases in received signal level. To explain the consequent alterations of the receiver operation, which alterations reduce the effects of received signal level variations on the output signal level at terminal O, the schematic details of the drawing will now be described.

In the illustrated circuitry for chip 30, the intermediate frequency signals supplied by selectivity network 20 to chip terminal T5 are directly applied to the base of a transistor Q101, disposed as an emitter-follower. In lieu of an emitter resistor, the collector-emitter path of a transistor Q119 provides a return to the ground terminal T4 of chip 30 from the emitter of Q101 (for reasons to be subsequently described).

The signals appearing at the emitter of transistor Q101 are applied to an attenuator formed by a resistor R101 and the emitter-collector path of a transistor Q103. An attenuated version of the emitter-follower output will appear at the resistor-transistor junction, the degree of attenuation depending upon the impedance presented by the emitter-collector path of transistor Q103. The functioning of this attenuator network will be described in greater detail subsequently.

The attenuator network output is supplied via a pair of emitter-followers (Q105 and Q107) is cascade to the base of a transistor Q109, the output of the cascaded emitter-followers appearing across emitter-resistor R107. Transistor Q109 is disposed in a cascode pair arrangement with transistor Q111 to form a high gain amplifying stage supplying an output to the chip's IF output terminal T8. In the cascode pair arrangement, Q109 is a base-input, grounded emitter stage, the collector of which is directly connected to the emitter-input, grounded base stage constituted by transistor Q111. Operating potential for the cascode amplifying stage is supplied from the B+ chip terminal T12 via an external resistor 56 and a coil of the selectivity network 40.

As previously explained, in addition to IF input signals, an AGC control potential is supplied to input terminal T5. By virtue of the direct coupling via emitter-follower Q101, resistor R101 and emitter-followers Q105 and Q107, such AGC input directly affects the bias at the base of transistor Q109 of the cascode pair. The supplied AGC potential variations are poled to provide reverse AGC action; that is, as signal strength increases, the bias voltage at the base of Q109 is made less positive to introduce a desired reduction in the gain of the cascode amplifying stage.

As discussed in my aforementioned copending application, Ser. No. 766,905, it is desirable to provide in addition to the gain variations of the cascode amplifying stage further aid in gain reduction, and, in particular, further aid of a character to provide, under strong signal conditions, a limitation on the voltage swing supplied to the base of transistor Q109, whereby distortion in that stage may be avoided. It is for such purpose that the previously mentioned R101/Q103 attenuator is provided.

Control of the attenuator is provided in the following manner. A transistor Q113 is provided, deriving its collector potential from an external receiver power supply via an external resistor 52, and with its base responding to the voltage at the base of transistor Q109 by virtue of the connection of resistor R113 between the respective bases. Under no-signal or weak-signal conditions, the base of transistor Q113 is sufficiently forward biased that the transistor is in saturation. Under such saturation conditions, an emitter-follower transistor Q115, having its base directly connected to the collector of transistor Q113 and its emitter returned to ground via resistors R115 and R116 in series, is held off. Transistor Q103, in the previously mentioned attenuator network, has its base directly connected to the emitter of the emitter-follower transistor Q115. Thus, under weak-signal conditions, transistor Q103 is likewise nonconducting, and, as a consequence, a constant, relatively small degree of attenuation is introduced by the R101/Q103 network. The interposition of the cascaded emitter-follower transistors Q105, Q107 in the signal path to the cascode amplifier input establishes a dynamic input impedance sufficiently high relative to the impedance of the attenuator resistor R101 as to ensure that the degree of attenuation of weak signals (when transistor Q103 is nonconducting) is indeed small.

Under strong signal conditions, however, the AGC depression of voltage at the base of transistor Q109 will reach a point at which transistor Q113 will come out of saturation allowing its collector to rise to a level sufficient to forward bias the emitter-follower transistor Q115. The emitter of transistor Q115 thereafter follows the rising base voltage; transistor Q103 will begin to conduct when the emitter of transistor Q115 rises to a positive voltage sufficient to overcome the reverse bias at the emitter of transistor Q103. For signal strengths above the conditions just described, the current drawn by transistor Q103 will increase and the impedance presented by the emitter-collector path of Q103 will decrease in consonance with signal strength increases to introduce greater and greater degrees of attenuation of the IF signal to be delivered to the base of transistor Q109.

An additional transistor Q117 is provided for driving the delayed RF AGC output terminal T6. The base of transistor Q117 is directly connected to the junction of the resistors R115 and R116 in the emitter circuit of emitter-follower Q115. The emitter of transistor Q117 is returned to ground via an emitter-resistor R117, while the collector of transistor Q117 is linked via chip terminal T6 and external resistor 58 to the B+ chip terminal T12. Under the no-signal and weak-signal conditions which hold transistor Q115 off, transistor Q117 is likewise off.

When, however, signal strength is sufficiently high that emitter-follower Q115 conducts sufficiently, the base of transistor Q117 becomes forward biased, and transistor Q117 commences conduction. Setting of threshold of RF AGC delivery may be controlled externally, as by the selection of the value of resistor 52 to determine the saturation current of the delay transistor Q113.

For signal levels above the selected threshold level, i.e., for AGC levels beyond that sufficient to remove transistor Q113 from saturation, and in turn render transistors Q115 and Q117 conducting, the voltage at terminal T6 will vary in accordance with the AGC potential at the base of Q107. Shifted to a lower voltage range by the shifting network formed by resistors 54 and 55 (in association with a negative potential supply), the varying voltage at the junction of resistors 54 and 55 constitutes a suitably delayed AGC potential for RF amplifier control in tuner 18. Filtering of the RF AGC potential is facilitated by the coupling of capacitor 57 between the resistor junction and the bypassed chip terminal T7.

It may be noted that, desirably, the delay threshold associated with the RF AGC drive transistor Q117 is less than the delay threshold associated with the attenuator transistor Q103. That is, RF AGC action is initiated at a lower level of signal strength (as indicated by the AGC potential) than the signal strength level at which attenuator action begins. Indeed, preferably, the full range of RF gain control is traversed before initiation of attenuator action. Thus, for example, in the illustrated circuit, the RF AGC drive transistor Q117 reaches saturation for a level of voltage at the emitter of transistor Q115 below that associated with the initiation of conduction of attenuator transistor Q103.

It should also be observed that, once attenuator action is commenced by the conduction of transistor Q103, a negative DC feedback loop of relatively high gain is completed, the loop including resistor R113 and transistors Q113, Q115, Q103, Q105 and Q107. A consequence of such feedback is that the bias at the base of transistor Q109 is held relatively constant in the face of further increases in the AGC potential supplied at terminal T5. Accordingly, the control sequence includes at least three distinct phases. In a first, relatively weak-signal level phase, AGC action is confined to gain variations for the cascode amplifier stage Q109, Q111; for a second medium-signal level phase, gain variations for the cascode amplifier stage are accompanied by RF gain variations; in a third, strong signal level phase, AGC action is confined essentially to the operation of the attenuator network R101, Q103. A fourth phase, involving a reversion to IF amplifier gain variations along, may optionally be associated with the transition between the above-mentioned second and third phases, as governed by the degree of separation of levels for transistor Q117 saturation and transistor Q103 conduction initiation.

As previously noted, the collector-emitter path of transistor Q119 provides a return to ground from the emitter of the input emitter-follower transistor Q101. The purpose of the use of transistor Q119 in lieu of an emitter resistor is to provide a relatively constant current supply for the emitters of transistors Q101 and Q103, with the current being of sufficient magnitude as to prevent the current "robbing" (from transistor Q101) by transistor Q103 from limiting the AGC range. That is, in the strong signal mode of operation, when transistor Q103 comes into conduction and draws greater and greater amounts of current, there will be a concomitant reduction of current through transistor Q101. To avoid cutoff of transistor Q101 under such circumstances, the emitters must see an adequate current source. Transistor Q119 serves as such a source, with its base suitably biased to establish a relatively constant current of the desired magnitude. The requisite bias current for supply transistor Q119 is derived from the emitter of the emitter-follower transistor Q105 by a biasing network comprising the series combination of resistor R104, resistor R105 and a forward biased stabilizing diode D101, with the base of transistor Q119 connected to the junction of resistors R104 and R105. The total resistance value of the series combination is chosen to give a bias current appropriate to set the constant current supply in the desired range. The resistance value of resistor R104 is chosen to be sufficiently large relative to that of resistor R105 to prevent transistor Q119 from introducing any significant degeneration of the AGC potential (in the weak-signal mode).

The circuitry of chip 30 additionally includes a decoupling network for supplying operating potentials to a number of transistor devices previously discussed. A regulated B+ voltage (illustratively, 11 volts) is developed by a regulator circuit 80 from a power supply (not illustrated) provided elsewhere in the receiver and is supplied to chip terminal T12. The B+ voltage is applied to a simple decoupling network comprising the series combination of resistor R119 and Zener diode Z101. While this simple network provides adequate decoupling, the Zener diode operation may introduce an undesired level of noise in the voltage appearing thereacross. Accordingly, the voltage across Zener diode Z101 is applied via an emitter-follower Q121 to a dynamic noise filter network comprising transistor Q123, resistor R121 and capacitor C101. The collector of transistor Q123 is directly connected to the emitter of transistor Q121. Resistor R121 links the base of transistor Q123 to the emitter of transistor Q121, while capacitor C101 is coupled between the base of transistor Q123 and the T4 ground lead. There is thus available at an emitter electrode of the filter transistor Q123 a relatively noise free B+ potential, adequately decoupled from additional circuits linked to terminal T12.

It has been found to be additionally advisable to decouple the collectors of transistors Q101 and Q103 from the collectors of subsequent stages in the chip circuitry. To this end, transistor Q123 is constructed in double-emitter form, with a first emitter supplying B+ potential to the collectors of transistors Q101 and Q103, and with a second emitter providing an isolated B+ potential source for the collectors of transistors Q105, Q107, Q109 and Q115. The base of the emitter-input transistor Q111 of the cascode amplifier is also returned to the latter B+ potential source.

Illustratively, one type of superheterodyne receiver in which the principles of the present invention have been successfully employed is a color television receiver. In the copending application of Jack Avins, Ser. No. 803,544, entitled "Amplifier Circuits" and filed concurrently herewith, details of such a color television receiver embodiment are presented. In that example of use, the circuitry shown herein for chip 30 was included on the same monolithic integrated circuit chip with additional circuitry performing such functions as final IF amplification, video detection, video amplification, AGC control potential development, intercarrier sound detector drive, intercarrier sound detection, intercarrier sound IF amplification, automatic fine tuning (AFT) drive and regulator reference control. The AGC control potential development circuits used therein embody the invention disclosed in my copending application, Ser. No. 803,590, entitled "Automatic Gain Control Circuit" and filed concurrently herewith, now abandoned in favor of a continuation-in-part application, Ser. No. 39,018, filed May 20, 1970.

By way of example only, a set of values for the circuitry of chip 30 and off-chip components associated therewith in the drawing, which values provided satisfactory operation in the aforementioned color television receiver embodiment, are set forth in the tables below:

TABLE A—ON-CHIP COMPONENT VALUES

| | | |
|---|---|---|
| Resistor R101 | ohms | 1,000 |
| Resistor R104 | do | 2,000 |
| Resistor R105 | do | 360 |
| Resistor R107 | do | 700 |
| Resistor R113 | do | 1,000 |
| Resistor R115 | do | 1,600 |
| Resistor R116 | do | 3,200 |

Table A: On-Chip Component Values continued:

| | | |
|---|---|---|
| Resistor R117 | do | 800 |
| Resistor R121 | do | 3,000 |
| Capacitor C101 | picofarads | 20 |

TABLE B—OFF-CHIP COMPONENT VALUES

| | | |
|---|---|---|
| Resistor 52 | ohms | 100,000 |
| Resistor 54 | do | 2,400 |
| Resistor 55 | do | 62,000 |
| Resistor 56 | do | 1,200 |
| Resistor 58 | do | 6,800 |
| Capacitor 53 | microfarad | .001 |
| Capacitor 57 | do | .100 |
| Capacitor 59 | do | .001 |

I claim:

1. In a superheterodyne receiver including a tuner for selective, controllable-gain amplification of received RF signals and conversion thereof to intermediate frequencies and an AGC source providing a DC potential varying in response to received signal level variations, the combination comprising:
   - an IF amplifier having an input circuit;
   - means including a dynamic attenuator network for applying the intermediate frequency output of said tuner and said varying DC potential from said AGC source to said IF amplifier input circuit;
   - an attenuator transistor included in said dynamic attenuator, the degree of conduction of said attenuator transistor controlling the degree of attenuation introduced by said attenuator network;
   - means including an RF AGC drive transistor for developing an RF AGC output for gain control of the RF signal amplification in said tuner;
   - and common amplitude delay means controlled by said varying DC potential for precluding conduction of both of said attenuator and RF AGC drive transistors when the received signal level falls in a first, weak-signal range, for precluding conduction of said attenuator transistor and permitting conduction of said RF AGC drive transistor when the received signal level falls in a second, medium-signal range, and for permitting conduction of both of said attenuator and RF AGC drive transistors when the received signal level falls in a third, strong-signal range.

2. Apparatus in accordance with claim 1 wherein said delay means includes a delay transistor biased into saturation in the absence of received signals.

3. Apparatus in accordance with claim 2 wherein conduction by said attenuator transistor when the received signal level falls in said strong-signal range closes a DC negative feedback loop opposing variations in the DC potential at said IF amplifier input circuit.

4. Apparatus in accordance with claim 1 wherein said amplitude delay means comprises means for driving said RF AGC drive transistor into saturation when the received signal level falls in said strong-signal range.

5. In a superheterodyne receiver including a tuner for selective, controllable-gain amplification of received RF signals and conversion thereof to intermediate frequencies and an AGC source providing a DC potential varying in response to received signal level variations, the combination comprising:
   - an IF amplifier having a input circuit;
   - signal translating means coupled between said tuner and said IF amplifier and responsive to said varying DC potential for applying the intermediate frequency signal output of said tuner to said IF amplifier input circuit without significant attenuation in a first operating mode prevailing when the level of said received signals falls in a given range of signal levels, and for applying the intermediate frequency output of said tuner to said IF amplifier input circuit with attenuation varying in accordance with said varying DC potential in a second operating mode prevailing when the level of said received signals exceeds said given range of signal levels;

and means for developing an RF AGC output for gain control of the RF signal amplification in said tuner;

said RF AGC output-developing means including an RF AGC drive transistor, and means for rendering said RF AGC drive transistor responsive to said varying DC potential in such manner as to preclude conduction of said RF AGC drive transistor when the received signal level falls in a first portion of said given range, to permit conduction of said RF AGC drive transistor to a degree varying in accordance with said DC potential variations when the received signal level falls in a second portion of said given range of higher level than said first portion, and to establish a substantially constant degree of conduction of said RF AGC drive transistor when the level of received signals exceeds said given range of signal levels.

6. A combination in accordance with claim 5 also incorporating means for controlling the gain of said IF amplifier in accordance with said varying DC potential when the received signal level falls in said first pôrtion of said given range.

7. A combination in accordance with claim 5 also incorporating means for controlling the gain of said IF amplifier in accordance with said varying DC potential whenever said first operating mode of said signal translating means prevails.

8. In a superheterodyne receiver including a tuner for selective, controllable-gain amplification of received RF signals and conversion thereof to intermediate frequencies and an AGC source providing a DC potential varying in response to received signal level variations, the combination comprising:

an IF amplifier having an input circuit, and subject to gain variations in accordance with said varying DC potential for a limited gamut of received signal levels;

signal-translating means coupled between said tuner and said IF amplifier and responsive to said varying DC potential for applying the intermediate frequency signal output of said tuner to said IF amplifier input circuit without significant attenuation in a first operating mode prevailing when the level of said received signals falls in a given range encompassing said limited gamut of signal levels, and for applying the intermediate frequency output of said tuner to said IF amplifier input circuit with attenuation varying in accordance with said varying DC potential in a second operating mode prevailing when the level of said received signals exceeds said given range of signal levels;

and means coupled to said signal-translating means and responsive to said varying DC potential for developing an RF AGC output for gain control of the RF signal amplification in said tuner;

said RF AGC output developing means including an RF AGC driver transistor, and means for rendering said RF AGC drive transistor responsive to said varying DC potential in such manner as to preclude conduction of said RF AGC drive transistor when the received signal level falls in a first, low level portion of said given range, to permit conduction of said RF AGC drive transistor to a degree varying in accordance with said DC potential variations when the received signal level falls in a second portion of said given range of higher level than said first portion, and to establish a substantially constant degree of conduction of said RF AGC drive transistor when the level of received signals exceeds said given range of signal levels.

9. In a superheterodyne receiver including a tuner having an RF amplifier for selective, controllable-gain amplification of received RF signals and means for converting the output thereof to intermediate frequencies, said receiver also including a controllable-gain IF amplifier having an input circuit, and a signal-translating network for applying the intermediate frequency signal output of said tuner to said IF amplifier input circuit; an automatic gain control system comprising the combination of:

means responsive to the output of said IF amplifier for providing a DC potential varying in response to received signal level variations;

first means responsive to said DC potential for causing said signal translating network to attenuate the intermediate frequency signal applied to said IF amplifier input circuit to a degree varying in accordance with the variations of said DC potential when the level of said received signals exceeds a predetermined range of intermediate signal levels to the exclusion of when the level of said received signals falls within or below said predetermined range of levels;

additional means responsive to said DC potential for controlling he gain of said RF amplifier in accordance with variations of said DC potential when the level of said received signals falls within said predetermined range of levels to the exclusion of when the level of said received signals falls below or above said predetermined range;

and further means responsive to said DC potential for controlling the gain of said IF amplifier in accordance with the variations of said DC potential when the level of said received signals falls below said predetermined range of levels.

10. Apparatus in accordance with claim 9 wherein said IF amplifier, said signal translating network, said attenuation causing means, said RF amplifier gain controlling means, and said IF amplifier gain controlling means are all realized in integrated form on a single, monolithic integrated circuit chip.